United States Patent

Haneda

[15] 3,659,218

[45] Apr. 25, 1972

[54] AMPLIFIER HAVING IMPROVED LOAD PROTECTIVE CIRCUIT

[72] Inventor: Yoshiaki Haneda, Tokyo, Japan

[73] Assignee: Sony Corporation, Tokyo, Japan

[22] Filed: Aug. 25, 1970

[21] Appl. No.: 66,703

[30] Foreign Application Priority Data

Aug. 28, 1969 Japan ....................44/68215

[52] U.S. Cl. ....................330/207 P, 330/18, 330/24, 330/15

[51] Int. Cl. ....................H03f 21/00

[58] Field of Search ....................330/207 P, 29, 138; 179/1 A, 179/1 F; 307/202; 317/33

[56] References Cited

UNITED STATES PATENTS

| | | | |
|---|---|---|---|
| 3,441,866 | 4/1969 | Barber et al. | 330/29 |
| 3,488,604 | 1/1970 | Smilowitz | 330/29 |
| 3,262,016 | 7/1966 | Martin | 317/33 |
| 3,536,958 | 10/1970 | Sondermeyer | 317/33 |
| 3,564,338 | 2/1971 | Teshirogi et al. | 317/31 |

*Primary Examiner*—Nathan Kaufman
*Attorney*—Hill, Sherman, Meroni, Gross & Simpson

[57] ABSTRACT

A load protective circuit for an output stage of an amplifier comprising means for detecting an undesirable DC voltage at the output of the amplifier and means for producing a control signal in response to the output of the detecting means for controlling a switching means and thereby remove the undesirable DC voltage from the output of the amplifier.

6 Claims, 5 Drawing Figures

INVENTOR.
YOSHIAKI HANEDA
BY Hill, Sherman, Meroni, Gross & Simpson ATTORNEYS

INVENTOR.

YOSHIAKI HANEDA

BY Hill, Sherman, Meroni, Gross & Simpson ATTORNEYS

AMPLIFIER HAVING IMPROVED LOAD PROTECTIVE CIRCUIT

BACKGROUND OF THE INVENTION

1. Field of the Invention

This invention relates in general to protective circuits for a load and in particular to a protective circuit for a load which is coupled to a push-pull amplifier supplied with power voltages from separate voltage sources.

2. Description of the Prior Art

Conventional amplifiers utilized in audio systems not using output transformers have single-ended push-pull amplifiers utilizing pairs of transistors in the last stage which are connected in series to a power source. An output signal is supplied to a speaker from the amplifier through a capacitor of relatively large capacitance. Such capacitors between the output of the amplifier and the speaker prevent DC bias voltage from being applied to the speaker. However, when the frequency of the audio signal is low, it will be substantially attenuated by the coupling capacitor and thus the low frequency outputs of the speaker will be substantially attenuated and will not be reproduced. It has been proposed to avoid this disadvantage of a coupling capacitor by using a two-source system in which the transistors of the last stage are connected in series to each other and are respectively supplied with positive and negative voltages. This allows the connection point of the transistors to be held at a substantially ground potential and the speaker is directly connected between the output of the transistors and ground. Thus in such an arrangement both sides of the speaker are at the same DC potential so that the speaker is driven directly by the output of the amplifier without receiving any DC bias voltage and is capable of reproducing signals of very low frequencies.

However, in such a system where the speaker is being directly driven, if the output of the amplifier becomes unbalanced due to a failure in the circuit, as for example, by the short-circuiting of a transistor or by an accidental change in the output of the one of the power sources, potential at the connection point between the last stage transistors will vary from ground potential and the speaker will receive a DC bias voltage and be subject to being destroyed.

SUMMARY OF THE INVENTION

The present invention provides a protective circuit for a single-ended push-pull amplifier which is directly coupled to a speaker in which the DC level at the output of the amplifier is detected and utilized to control a switching means that is connected in circuit with the amplifier so as to protect the speaker. Different embodiments are illustrated with one embodiment arranged to protect a single speaker and a second embodiment connected in circuit with two or more speakers and their respective driving amplifiers so as to protect all of the speakers.

Another object of the invention is to provide an amplifier which is directly coupled to a load and which includes a protective circuit for preventing injury to the load.

Yet another object of the invention is to provide a single-ended push-pull amplifier in combination with an improved load protective circuit.

These and other objects, features and advantages of the present invention will be understood in greater detail from the following description and associated drawings wherein reference numerals are utilized in describing the illustrative embodiments.

DESCRIPTION OF THE PREFERRED EMBODIMENTS

Figure 1:
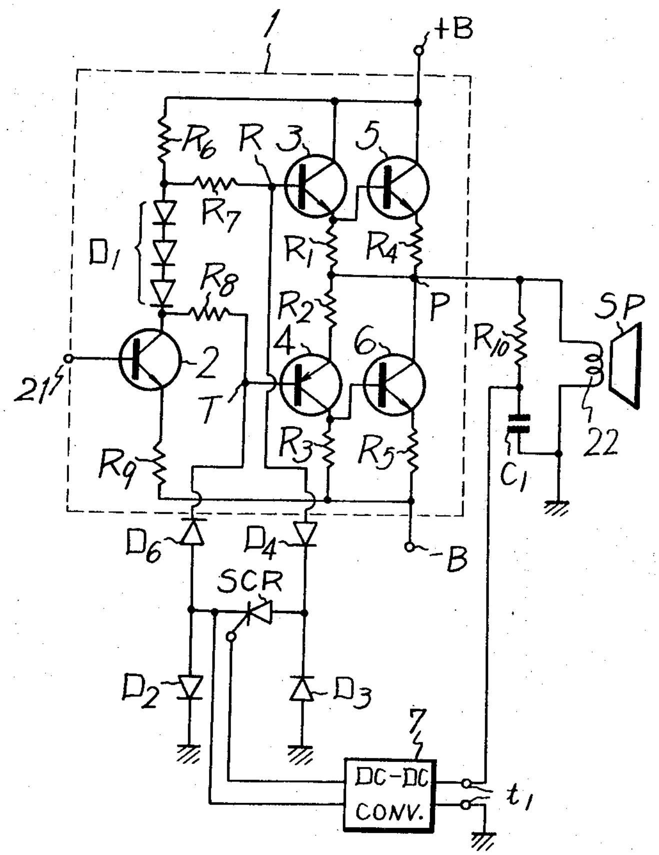
FIG. 1 is a schematic view illustrating the invention.

FIG. 1 is a schematic view of a preferred embodiment of the invention illustrating a single-ended push-pull amplifier designated generally as 1 and which includes a driving transistor 2 which receives an input on its base electrode 21. A B+ power supply is connected to the collectors of transistors 3 and 5 and to one side of a resistor R6. The other side of resistor R6 is connected to a plurality of series connected diodes designated generally as D1. The collector of transistor 2 is connected to the other terminal of the series connected diodes D1. The resistor R7 is connected between the resistor R6 and the base of transistor 3. A resistor R8 is connected between the collector of transistor 2 and the base of transistor 4. A pair of resistors R1 and R2 are connected in series between emitters of transistors 3 and 4. The base of transistor 5 is connected to the emitter of transistor 3 and a resistor R4 is connected between the emitter of transistor 5 and an output terminal P. The collector of transistor 6 is connected to terminal P and the emitter of transistor 6 is connected to a B− supply through a resistor R5. The collector of transistor 4 is connected ghrough a resistor R3 to the B− supply. The emitter of transistor 2 is connected through a resistor R9 to the B− supply. The junction point between resistors R1 and R2 is connected to the output terminal P which is connected to one side of a speaker coil 22 of a speaker SP. The other side of the speaker coil 22 is connected to ground. A resistor R10 and capacitor C1 are connected in parallel with the speaker coil 22. A DC converter circuit 7 has one input terminal connected to ground and the other terminal connected to the connection point between resistor R10 and capacitor C1. The output of the DC to DC converter 7 is connected to the gate of an SCR and the other side of the output is connected to the cathode of the SCR. A diode D2 has its anode connected to the cathode of the SCR and its anode connected to ground. The diode D3 has its anode connected to ground and its cathode connected to the anode of the SCR. A diode D4 has its anode connected to the base of transistor 3 and its anode connected to the anode of the SCR. A diode D6 has its anode connected to the cathode of the SCR and its cathode connected to the base of transistor 4.

The transistors 3–6 of the power amplifier are respectively opposite in conductivity types as for example, if the transistor 3 is an NPN type, the transistor 4 is a PNP type.

The bases of the transistors 3 and 4 receive exciting signals of the same amplitude and phase. The first exciting signal is applied to the base of the transistor 3 through the resistor R7 from the connection point of the diodes D1 with the resistor R6 and a second exciting signal is applied to the base of transistor 4 through resistor R8 from connection point of the diodes D1 with the collector of the transistor 2. The bias circuit of the transistor 2 is omitted since it is well known to those skilled in the art.

In the circuit of FIG. 1 the DC potential at the output point P at one end of the speaker coil 22 under normal operation remains at substantially ground potential because the negative and positive power supplies, B+ and B−, have positive and negative voltages substantially equal to each other. This allows the speaker SP to be energized without any DC bias current in the speaker coil 22.

The present invention detects any undesired DC bias voltage which appears across the speaker coil 22 and energizes a switching element comprising the SCR to clamp the potential of the output of the amplifier to a predetermined value and thereby prevent DC bias current from being applied to the speaker coil 22 even when the DC balance of the amplifier has been destroyed. The DC to DC converter 7 detects any desired DC bias voltage applied to the speaker coil 22 and energizes the SCR.

Figure 2:
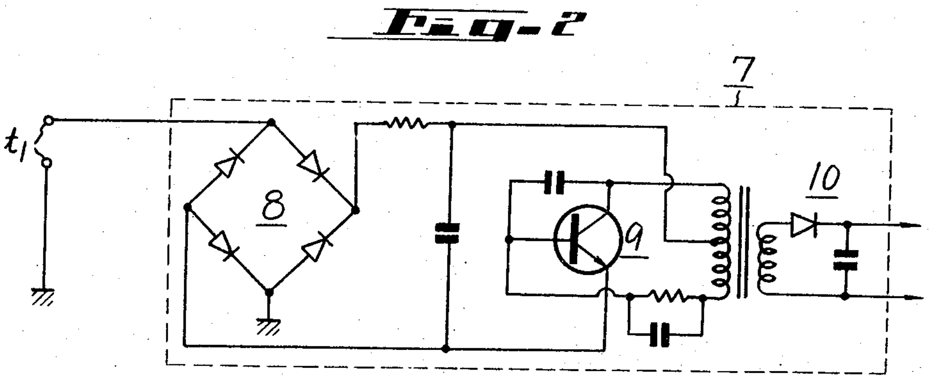
FIG. 2 is a schematic view of a DC to DC converter of the invention.

As shown in FIG. 2, the DC to DC converter 7 comprises a full wave rectifier 8 which receives any DC bias voltage from an input terminal $t1$ connected across the capacitor of large value, Cl. An oscillator 9 includes a transistor which is energized by full-wave rectifier 8 when a DC signal exists between terminals $t1$ and drives an output transformer which is connected to a rectifier 10 which detects the output of the oscillator 9 and rectifies it.

For example, if an input signal of about 2 volts is applied between the input terminals $t1$, the oscillator 9 will oscillate and its output will be rectified by the rectifier 10 and will be applied to the gate of the SCR to turn it on. It is to be noted that the full-wave rectifier 8 allows the oscillator 9 to be energized so that the SCR is gated on for either a positive or a negative voltage appearing across the condenser C1.

When SCR is gated on it will clamp the output of the amplifier 1 at a predetermined value so as to prevent the speaker coil 22 and the speaker from being injured.

Figure 3:
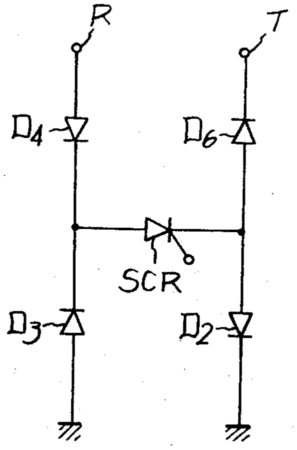
FIG. 3 is a schematic view illustrating the switching means for explaining the principle of the circuit of FIG. 1.

FIG. 3 illustrates the connection of the SCR and the diodes D2, D3, D4 and D6. Terminals T and R comprise respectively the base electrodes of transistors 4 and 3. It may be observed that when the SCR is conducting, current may flow from terminal R through the diode D4, SCR and D2 to ground. Current may flow from ground through diode D3, the SCR and diode D6 to terminal T. Thus when the silicon controlled rectifier SCR conducts the terminals R and T are maintained at substantially ground potential. As a practical matter, of course, the potential of the terminals R and T will differ from ground voltage by the forward voltages across the diodes D4, D2 and the SCR, and the diodes D3, the SCR and D6, respectively. In silicon diodes, the forward voltage drop is about 0.6 to 0.7 volts and thus terminal R will be approximately 1.8 volts above ground potential when the SCR conducts and terminal T will be about 1.8 volts below ground potential when the SCR conducts. When the SCR is not in the conduction state the terminals R and T are not held at ground potential because of the high resistance of the silicon controlled rectifier SCR.

In operation, when a fault occurs such that DC potential at the output terminal P is increased because the input signal is applied only to the transistor 3 for some reason, the DC bias voltage will be detected and applied to the DC – DC converter to render the silicon controlled rectifier SCR conductive and thus clamp the voltage at the bases of transistors 3 and 4 to ground and thus turn off the amplifier 1 so that the speaker is not injured. The signal might disappear from the transistor 4 if the resistor R8 fails, for example. The transistors 3, 4, 5 and 6 comprise a power amplifier and they have substantially no voltage gain.

Since in the present invention the detected DC bias voltage to be applied to the load is supplied to the switching element for controlling the output stage through the DC-DC converter, the level of the detected voltage and the level for initiation of the operation of the switching element SCR may be independently selected which allows a circuit to be designed which is very reliable. Also, it is to be noted that the switching element does not interfere with the operation of the amplifier under normal conditions.

Figure 4:
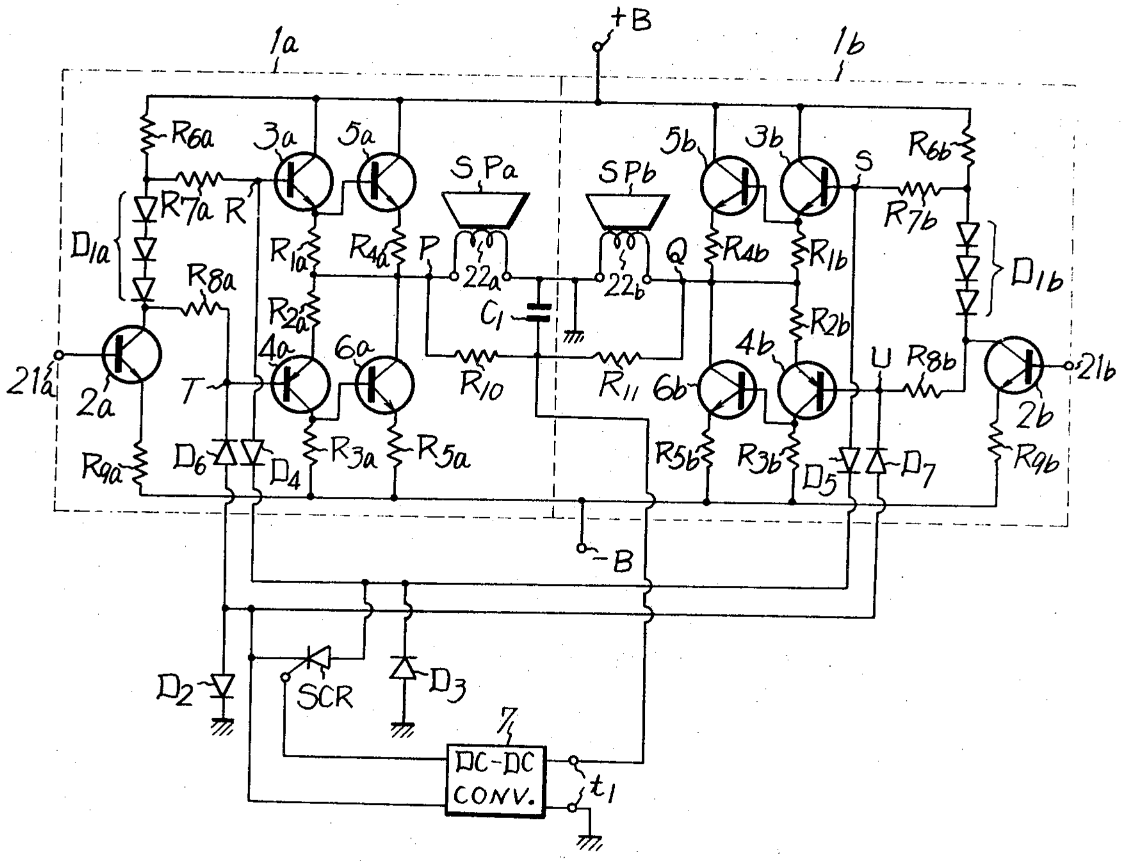
FIG. 4 illustrates a modification of the invention.

FIG. 4 illustrates an embodiment of the invention applied to a stereo reproducing system. Left and right channel systems are symmetrical and similar elements in each channel are identified as in FIG. 1 with the subscript $a$ or $b$ respectively identifying the two systems. For example, 1a illustrates the system according to FIG. 1 and system 1b illustrates a second system according to Figure 1. Input terminal 21a supplies an input to the amplifier 1a and speaker coil 22a drives speaker SPa. Input terminal 21b drives amplifier 1b and speaker coil 22b drives speaker SPb.

The resistors R10 and R11 are connected in series between points P and Q and first sides of the speaker coils 22a and 22b. The condenser C1 is connected between the other side of the speaker coils 22a and 22b and the junction point of resistors R10 and R11. The point between resistors R10 and R11 is connected to the DC–DC converter 7. The output of the DC–DC converter 7 controls an SCR switching element to clamp the potentials of the output of the amplifiers 1a and 1b at predetermined values in the same manner as in the case of FIG. 1. Diodes D5 and D7 are connected to transistors 3b and 4b of the amplifier 1b in the same manner as diodes D4 and D6 are connected to transistors 3a and 4a in amplifier 1a.

Figure 5:
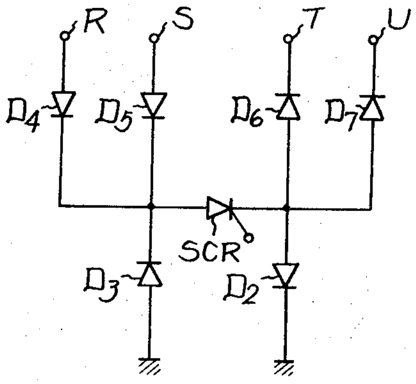
FIG. 5 is a schematic view illustrating the principles of the switching means of FIG. 4.

FIG. 5 illustrates the diode connection to the SCR and it is to be noted that diodes D2 and D3 are connected respectively between ground and the cathode and anode of the SCR. These diodes are poled in opposite directions as shown. Diodes D4 and D5 are connected with their cathodes connected to the anode of the SCR. The anode of D4 is connected to point R comprising the base of transistors 3a and diode D5 has its anode connected to point S comprising the base of transistor 3b. Diodes D6 and D7 have their anodes connected to the cathodes of SCR and the cathode of diode D6 is connected to point T comprising the base of transistor 4a. The cathode of D7 is connected to point U comprising the base of transistor 4b.

If any of the components of amplifiers 1a and 1b fail at the same time and bias voltages of opposite polarity are applied to terminals P and Q, these bias voltages will cancel each other and a signal will be produced. As a practical matter, however, the probability that both of the amplifiers will fail simultaneously is almost zero and it is extremely remote that both the output terminals P and Q will be simultaneously biased in opposite polarities. Thus the possibility of burning out the speaker coils 22a and 22b due to a lack of detected signals is negligible.

When a stereophonic signal is being received, the speakers SPa and SPb are driven at a level balanced with each other and the capacitor C1 has relatively large capacitance and is connected between the connection point of the resistors R10 and R11 and ground so that the AC component is bypassed by the capacitor C1 and the detected signal applied to the DC–DC converter 7 will contain only a DC bias voltage. Thus, there is almost no possibility of the load protective circuit failing to perform.

Although the invention has been described as connected to one amplifier or two amplifiers for two channels of a stereo reproducer, it is to be realized that the invention is applicable to three or more amplifiers. In such systems detected signals are respectively applied to the DC–DC converter from the respective output terminals of the amplifiers through resistors corresponding to R10 and R11 and the signal systems of the amplifiers are connected to the cathode or anode of the silicon controlled rectifier through diodes (such as D4–D7) so that the loads of the amplifiers can be protected with one DC–DC converter and one silicon controlled rectifier. It is thus seen that the switching element need not be limited to a silicon controlled rectifier but may be any other switching element.

It is seen that this invention provides protection in a simple and inexpensive manner and although it has been described with respect to preferred embodiments it is not to be so limited as changes and modifications may be made as defined by the appended claims.

What is claimed is:

1. A protective circuit comprising:

first and second transistors, a first voltage source of a first polarity, a second voltage source of a second polarity, said first and second transistors connected in series between said first and second voltage sources;

a speaker with a driving coil and one side of said coil connected to ground;

a first resistor, a capacitor with one side connected to one side of said first resistor and its other side connected to ground, the other side of said first resistor connected to the other side of said driving coil;

an output point between said series connected first and second transistors which under normal operation is at DC ground potential connected to said other side of said driving coil;

third and fourth transistors connected in series between said first and second voltage sources and an output point between said series connected third and fourth transistors connected to said other side of said driving coil, said third and fourth transistors respectively connected to base electrodes of said first and second transistors to control them;

second and third resistors, first diode means, one side of said second resistor connected to the base of said third transistor, the second side of said second resistor connected to one side of said first diode means, the second side of said first diode means connected to the first side of said third resistor and the second side of said third resistor connected to the base of said fourth transistor;

means applying an input signal across said first diode means;

second and third diodes connected in series with their cathodes connected together between the base of said third transistor and ground;

fourth and fifth diodes connected in series with their anodes connected together between the base of said fourth transistor and ground, a silicon controlled rectifier with its anode annected to the cathodes of said second and third diodes and its cathode connected to the anodes of said fourth and fifth diodes; and said one side of said capacitor coupled to the gate of said silicon controlled rectifier.

2. A protective circuit according to claim 1 including a direct current amplifier connected between the gate of said silicon controlled rectifier and said one side of said capacitor.

3. A protective circuit according to claim 2 wherein said direct current amplifier comprises a first rectifier connected between ground and said one side of said capacitor, an oscillator connected to the output of said first rectifier and adapted to oscillate upon receiving a direct current output from said first rectifier, a second rectifier connected to the output of said oscillator and the output of said second rectifier connected to the gate of said silicon controlled rectifier.

4. A protective circuit according to claim 3 wherein said means applying an input signal includes a fifth transistor to which said input signal is applied and said fifth transistor connected in circuit with said first diode means.

5. A protective circuit according to claim 4 comprising a second speaker with a driving coil with one side connected to ground, a fourth resistor connected between the other side of said driving coil of said second speaker and said one side of said capacitor, sixth and seventh transistors connected in series between said first and second voltage sources and an output point between said sixth and seventh transistors which under normal operating conditions is at direct current ground connected to said other side of the driving coil of said second speaker, eighth and ninth transistors connected in series between said first and second voltage sources and an output point between said series connected eighth and ninth transistors connected to the other side of the driving coil of said second speaker, said eighth and ninth transistors respectively connected to the base electrodes of said sixth and seventh transistors to control them, fourth and fifth resistors, sixth diode means, one side of said fourth resistor connected to the base of said eighth transistor, the second side of said fourth resistor connected to one side of said sixth diode means and the second side of said sixth diode means connected to the first side of said fifth resistor and the second side of said fifth resistor connected to the base of said seventh transistor, means applying a second input signal across said sixth diode means, a seventh diode connected between the base of said eighth transistor and the anode of said silicon controlled rectifier and an eighth diode connected between the base of said ninth transistor and the cathode of said silicon controlled rectifier.

6. A protective circuit according to claim 5 wherein said means applying a second input signal includes a tenth transistor to which said second input signal is applied and said tenth transistor connected in circuit with said sixth diode means.

* * * * *